US011444076B2

(12) United States Patent
Gauthier, Jr. et al.

(10) Patent No.: US 11,444,076 B2
(45) Date of Patent: Sep. 13, 2022

(54) INTEGRATED CIRCUIT STRUCTURE WITH AVALANCHE JUNCTION TO DOPED SEMICONDUCTOR OVER SEMICONDUCTOR WELL

(71) Applicant: GLOBALFOUNDRIES U.S. Inc., Santa Clara, CA (US)

(72) Inventors: Robert J. Gauthier, Jr., Williston, VT (US); Alain F. Loiseau, Williston, VT (US); Souvick Mitra, Essex Junction, VT (US); Tsung-Che Tsai, New York, NY (US); Meng Miao, Williston, VT (US); You Li, South Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 192 days.

(21) Appl. No.: 16/983,071

(22) Filed: Aug. 3, 2020

(65) Prior Publication Data

US 2022/0037309 A1    Feb. 3, 2022

(51) Int. Cl.
 *H01L 27/02*  (2006.01)
(52) U.S. Cl.
 CPC ...... *H01L 27/0259* (2013.01); *H01L 27/0255* (2013.01)
(58) Field of Classification Search
 None
 See application file for complete search history.

(56) References Cited

U.S. PATENT DOCUMENTS

| 7,323,752 | B2 | 1/2008 | Chu et al. | |
|---|---|---|---|---|
| 7,973,386 | B1* | 7/2011 | Vashchenko | H01L 29/866 257/E27.053 |
| 9,214,540 | B2 | 12/2015 | Tsai et al. | |
| 2008/0044955 | A1* | 2/2008 | Salcedo | H01L 29/7436 257/E21.338 |
| 2013/0277745 | A1* | 10/2013 | Tsai | H01L 21/761 257/355 |
| 2015/0041890 | A1* | 2/2015 | Campi, Jr | H01L 29/7835 257/339 |
| 2015/0311193 | A1* | 10/2015 | Laine | H01L 29/0649 257/491 |
| 2020/0091138 | A1* | 3/2020 | Liang | H01L 27/0262 |
| 2022/0037309 | A1* | 2/2022 | Gauthier, Jr | H01L 27/0255 |

* cited by examiner

*Primary Examiner* — Steven M Christopher
(74) *Attorney, Agent, or Firm* — Anthony Canale; Hoffman Warnick LLC

(57) ABSTRACT

Embodiments of the disclosure provide an integrated circuit (IC) structure, including a doped well in a semiconductor substrate, in addition to a base region, emitter region, and collector region in the doped well. An insulative material is within the doped well, with a first end horizontally adjacent the collector region and a second end opposite the first end. A doped semiconductor region is within the doped well adjacent the second end of the insulative material. The doped semiconductor region is positioned to define an avalanche junction between the collector region and the doped semiconductor region across the doped well.

14 Claims, 4 Drawing Sheets

INTEGRATED CIRCUIT STRUCTURE WITH AVALANCHE JUNCTION TO DOPED SEMICONDUCTOR OVER SEMICONDUCTOR WELL

TECHNICAL FIELD

Embodiments of the disclosure relate generally to integrated circuit (IC) structure. More specifically, various embodiments of the disclosure provide an IC structure with an avalanche junction to a doped semiconductor over a semiconductor well.

BACKGROUND

Integrated circuits (ICs) may include elements for protecting the device hardware against electrostatic discharge (ESD) voltages that can cause electrical shorts, dielectric breakdown, and/or other failure modes. In an ideal setting, ESD elements have no effect on the device operation until an ESD event is seen by a pin on an IC where the ESD event acts as a trigger voltage, which turns on the ESD devices and discharges current through the ESD element to power, or ground supply rails. ESD elements may be designed to adjust their trigger voltages to allow input voltages that are higher than the power supply voltage without causing excess leakage through the ESD devices at elevated voltages. As ICs continue to become smaller and their scale decreases, lower trigger voltages may be needed for compliance with manufacturing specifications for the device. However, conventional approaches for reducing the trigger voltage can have the undesired effect of raising the holding voltage of the ESD element, i.e., the voltage level to which the device returns after the ESD element ceases operating. Conventional configurations for ESD elements and/or other structures have been unable to provide lower trigger voltages while keeping holding voltages the same or reducing them as well.

SUMMARY

Aspects of the present disclosure provide an integrated circuit (IC) structure, including: a doped well in a semiconductor substrate, the doped well having a first doping type; a base region within the doped well, and having the first doping type; an emitter region within the doped well and having a second doping type opposite the first doping type; a first insulator within the doped well, horizontally between the base region and the emitter region; a collector region within the doped well and having the second doping type; a second insulator within the doped well, horizontally between the collector region and the emitter region; an insulative material within the doped well, the insulative material having a first end horizontally adjacent the collector region and a second end opposite the first end; and a doped semiconductor region within the doped well adjacent the second end of the insulative material, wherein the doped semiconductor region is of the first doping type, such that an avalanche junction is defined between the collector region and the doped semiconductor region across the doped well.

Further aspects of the present disclosure provide an integrated circuit (IC) structure, including: a first doped well in a semiconductor substrate, and having a first doping type; a base region within the first doped well, and having the first doping type; a second doped well having a first end adjacent the first doped well, and a second end opposite the first end, the second doped well having a second doping type opposite the first doping type; a first insulator within the first doped well, horizontally between the base region and the second doped well; a third doped well adjacent the second end of the second doped well, the third doped well having the first doping type; an emitter region within the third doped well, the emitter region having the second doping type; a second insulator within the third doped well, horizontally between the emitter region and the second doped well; a collector region within the third doped well and having the second doping type; a third insulator within the third doped well, horizontally between the emitter region and the second doped well; an insulative material within the third doped well, the insulative material having a first end horizontally adjacent the collector region and a second end opposite the first end; and a doped semiconductor region within the third doped well adjacent the second end of the insulative material, wherein the doped semiconductor region is of the first doping type, such that an avalanche junction is defined between the collector region and the doped semiconductor region across the doped well.

Yet another aspect of the present disclosure provides an integrated circuit (IC) structure, including: a first doped well in a semiconductor substrate, and having a first doping type; a second doped well within the first doped well, the second doped well having a second doping type opposite the first doping type, wherein an upper surface of the second doped well is coplanar with an upper surface of the first doped well; a third doped well within the first doped well, and having the first doping type, wherein an upper surface of the third doped well is coplanar with the upper surface of the second doped well; a base region within the third doped well, and having the first doping type; a collector terminal within the third doped well and laterally separated from the base region by a first insulator, the collector terminal including a first pair of oppositely-doped semiconductor regions separated by a first insulative material within the third doped well, such that a first avalanche junction is defined between the first pair of oppositely-doped semiconductor regions; and an emitter terminal within the third doped well and laterally separated from the collector terminal by a second insulator, the emitter terminal including a second pair of oppositely-doped semiconductor regions separated by a second insulative material within the third doped well, such that a second avalanche junction is defined between the second pair of oppositely-doped semiconductor regions.

BRIEF DESCRIPTION OF THE DRAWINGS

These and other features of this disclosure will be more readily understood from the detailed description of the various aspects of the disclosure taken in conjunction with the accompanying drawings that depict various embodiments of the disclosure, in which.

Figure 1:
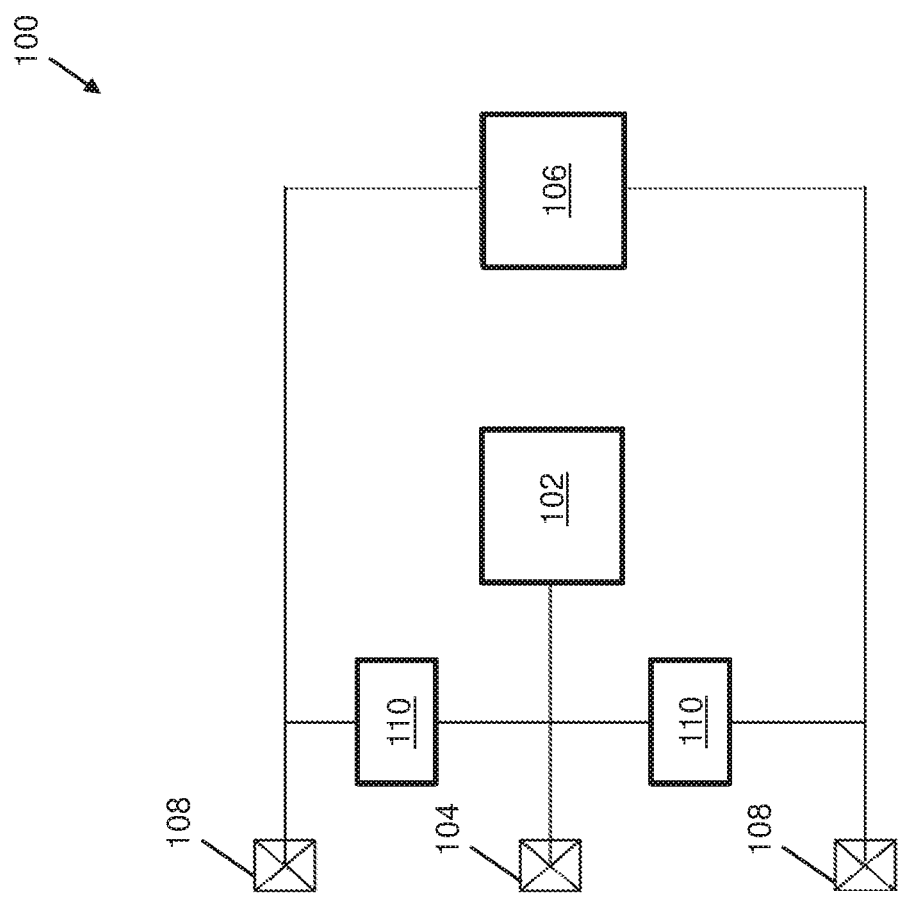
FIG. 1 provides a schematic view of active elements of an integrated circuit (IC) structure connected via electrostatic discharge (ESD) elements according to embodiments of the disclosure.

It is noted that the drawings of the disclosure are not necessarily to scale. The drawings are intended to depict typical aspects of the disclosure, and therefore should not be considered as limiting the scope of the disclosure. In the drawings, like numbering represents like elements between the drawings.

DETAILED DESCRIPTION

In the description herein, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made within the scope of the present teachings. The description herein is, therefore, merely illustrative.

Embodiments of the disclosure provide an integrated circuit (IC) structure featuring an avalanche junction to a doped semiconductor region over a semiconductor well. In some cases, embodiments of the disclosure can provide an electrostatic discharge (ESD) element in which the avalanche junction provides a bi-directional current pathway to provide a lower trigger voltage, while maintaining substantially the same holding voltage as compared to conventional ESD elements. According to an example, embodiments of the disclosure may include a doped well in a semiconductor substrate and a base region in the doped well. The base region and doped well may have the same doping type. An emitter region of a second doping type, opposite the first doping type, may be in the semiconductor well and separated from the base region by a first insulator. A second insulator in the doped well can separate the emitter region from a collector region that has the second doping type. An insulative material adjacent the collector region may separate the collector region from a doped semiconductor region. A portion of the doped well beneath the insulative material, also between the collector and doped semiconductor region, may provide a diode in the form of an avalanche junction for bi-directional control of current through the IC structure. Voltages applied to the avalanche junction can affect whether current is able to flow between the emitter and the collector.

A diode is a two-terminal element that behaves differently from conductive or insulative materials between two points of electrical contact. Specifically, a diode provides high conductivity from one contact to the other in one direction (i.e., the "forward" direction) but provides little to no conductivity in the opposite direction (i.e., the "reverse" direction). In the case of the P-N junction, the orientation of a diode's forward and reverse directions may be contingent on the type and magnitude of voltage applied to the material composition of one or both terminals, which affect the size of the potential barrier. In the case of a junction between two semiconductor materials, the potential barrier will form along the interface between the two semiconductor materials.

Embodiments of the disclosure use the distinct attributes of an "avalanche junction," also known as an "avalanche diode," to provide bidirectional control of current flows through the IC structure. Avalanche junctions are distinct from P-N diodes by featuring conductive material adjacent an insulative material between two terminals. In various implementations, the materials may be sized and placed to prevent substantially any current flow between the two terminals. Applying an electrical voltage to the materials may accelerate minority charge carriers in the insulative material to an extent that creates ionization in a crystal lattice. In turn, the accelerated minority charge carriers produce more charge carriers and more electrical ionization. This effect is known as "avalanche breakdown." In this scenario, an electrical pathway can form in either direction from one terminal to another. Avalanche diodes are distinct from other diodes, e.g., by providing a voltage drop across the two terminals that is constant and independent of the amount of current passing therethrough. Embodiments of the disclosure use these properties to provide electrically protective features (e.g., ESD elements) in a device structure.

Referring to FIG. 1, a schematic view of a device 100 according to embodiments of the disclosure is shown. Device 100 provides an example configuration where embodiments of an IC structure, as discussed in further detail with respect to other drawings, may be deployed. Device 100 is configured to react to excess charges and currents originating from an ESD event by preventing current flow into active components (e.g., internal circuitry 102) of device 100. An input/output (I/O) pad 104 may electrically couple an input voltage and/or signal to internal circuitry 102 via any form of wiring. Excess charge created by an ESD event may be transmitted to device 100 via I/O pad 104. A power clamp 106 may be designed to short such excess charges from power to ground. Power clamp 106 may be provided in the form of any conceivable transistor element (e.g., field effect transistor (FET) or bipolar junction transistor (BJT)). A set of voltage nodes 108 (commonly denoted "VDD" for a power rail and "VSS" for a ground rail, respectively) can deliver voltage (e.g., from a battery or other device for driving device 100) to drive power clamp 106. It is understood that the VDD and VSS designations for power and ground rails may be switched in further implementations. Power clamp 106 is not designed to operate under non-ESD conditions with variations in voltage. In particular, power claim 106 remains dormant during power up and power down operations where voltages may fluctuate. Power clamp 106 will selectively allow current flow upon detecting an ESD event.

A set of ESD elements 110 may be coupled between internal circuitry 102 and power supply/power clamp (simply "power clamp" hereafter) 106, to activate power clamp 106 during an ESD event. ESD element(s) 110 may prevent current flow from I/O pad 104 to power clamp 106 unless, or until a trigger voltage is applied to the corresponding terminal of ESD element(s) 110. In various other examples, additional circuitry and/or current paths may be located between I/O pad 104 and ESD element(s) 110, or between ESD element(s) 110 and power clamp 106 to further control the directing of current to power clamp 106 during an ESD event.

Figure 2:
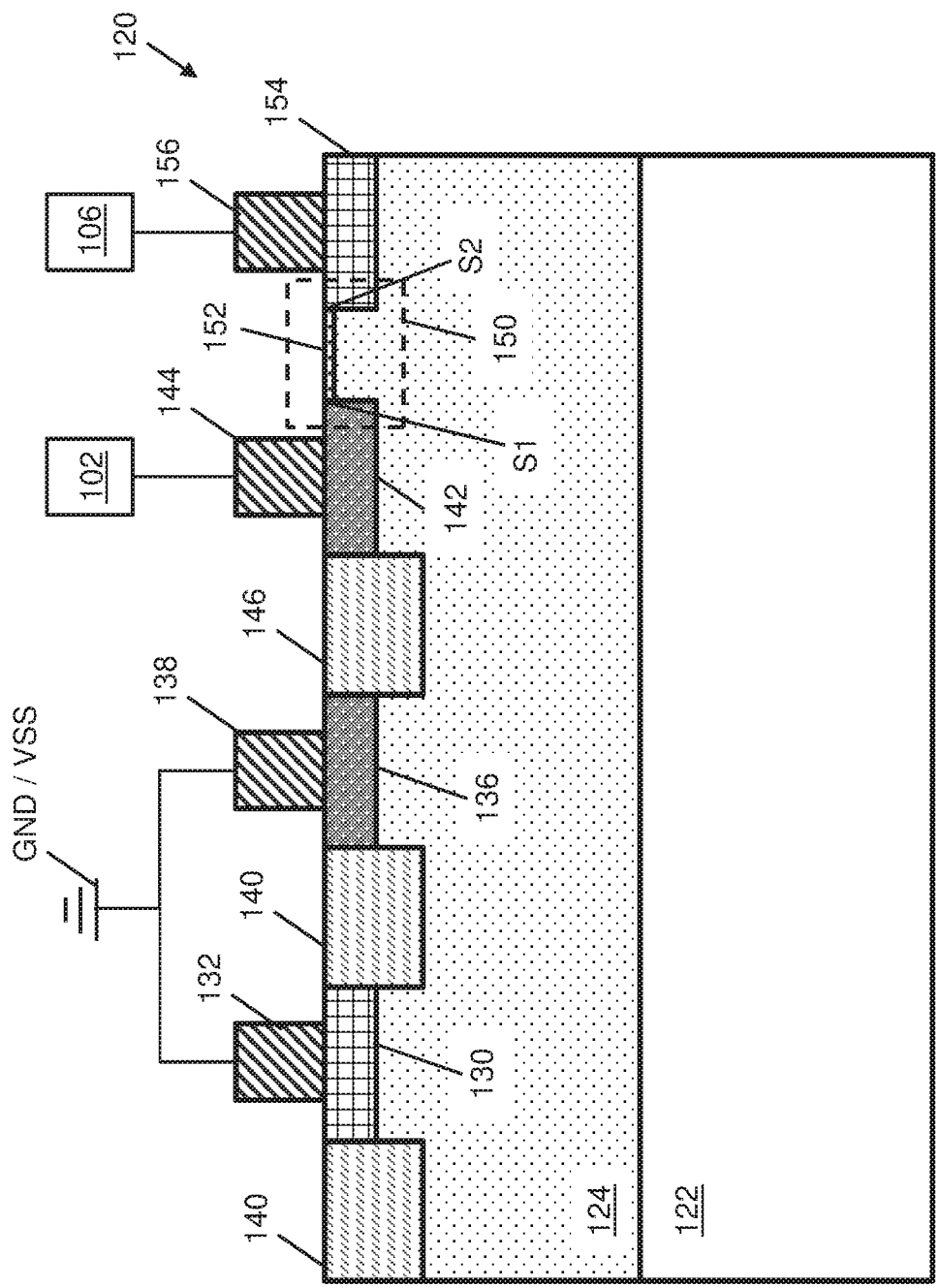
FIG. 2 shows a cross-sectional view an IC structure according to embodiments of the disclosure.

Referring now to FIG. 2, embodiments of the disclosure include an integrated circuit (IC) structure 120 capable of providing ESD element(s) 110 (FIG. 1), or otherwise implementing similar functions. IC structure 120 may be formed from a substrate 122 including, e.g., one or more semiconductor materials. Substrate 122 can include any currently known or later-developed semiconductor material, which may include without limitation, silicon, germanium, silicon carbide, and those including essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 122 or a portion thereof may be strained.

Portions of substrate 122 may include dopants, and thus may provide a first doped well 124 having a first doping type. According to one example, the first doping type may be P-type doping. When referring to dopants, P-type dopants refer to elements introduced into semiconductor material to generate free holes by "accepting" electrons from a semiconductor atom and consequently "releasing" the hole. The acceptor atom must have one valence electron less than the host semiconductor. P-type dopants suitable for use in substrate 122 may include but are not limited to: boron (B), indium (In) and gallium (Ga). Boron (B) is the most common acceptor in silicon technology. Further alternatives include In and Ga. Ga features high diffusivity in silicon dioxide ($SiO_2$), and hence, the oxide cannot be used as a mask during Ga diffusion. First doped well 124 may be formed within substrate 122, e.g., by vertical ion implantation, such that an upper surface of first doped well 124 is aligned, and thus shared, with the upper surface of substrate 122. Although first doped well 124 may have the same doping type as substrate 122, first doped well 124 may have a higher or lower dopant concentration than substrate 122. First doped well 124 thus may be distinguished from substrate 122 at least partially based on its doping concentration, dopant materials, etc., even where first doped well 124 and substrate 122 are of the same doping type. Substrate 122 may include other doped wells having the same, or different doping types, and such wells are omitted from FIG. 2 solely for clarity. It is also understood that first doped well 124 may be positioned within and/or alongside a guard ring (not shown) for separating and isolating first doped well 124 from other portions of device 100 (FIG. 1). Such guard rings may take the form of, e.g., oppositely-doped regions of semiconductor material adjacent and/or surrounding first doped well 124.

IC structure 120 may be configured to direct current flow from a "collector" terminal to an "emitter" terminal, and thus may include the same or similar arrangement of doped semiconductor materials as in a bipolar junction transistor (BJT) architecture within first doped well 124. However, IC structure 120 is not configured to operate as a standard transistor forward biased (e.g., BJT) because two terminals are coupled to ground as noted herein. IC structure 120 thus may include a base region 130 within first doped well 124. Base region 130 may have the same doping type (e.g., p-type doping) as first doped well 124, and similarly may be located at the upper surface of first doped well 124. Base region 130 may have a higher dopant concentration than first doped well 124, and thus is indicated by different cross-hatching in FIG. 2. Base region 130 may be electrically coupled to ground ("GND/VSS") through a first contact 132, formed of a conductive material (e.g., one or more metals formed by deposition, patterning, and/or other processes) on base region 130.

IC structure 120 further may include an emitter region 136 within first doped well 124. Emitter region 136 may have a second doping type that is opposite the doping type of first doped well 124 and base region 130 (e.g., N-type doping). Emitter region 136 may be formed by implanting N-type dopants into substrate 122 and/or precursor semiconductor material by any currently known or later developed technique, e.g., ion implantation. N-type dopants are elements introduced into semiconductor materials to generate free electrons, e.g., by "donating" an electron to semiconductor. N-type dopants must have one more valance electron than the semiconductor. Common N-type donors in silicon (Si) include, e.g., phosphorous (P), arsenic (As), and/or antimony (Sb). A second contact 138, which may be formed of any conductive material (e.g., one or more metals formed by deposition, patterning, and/or other processes) on emitter region 136. Second contact 138 can electrically couple emitter region 136 to ground GND/VSS, similarly to the connection provided by first contact 132.

A first insulator 140 within first doped well 124 can be positioned horizontally between base region 130 and emitter region 136, to physically and electrically separate base region 130 from emitter region 136. First insulator 140 may include any conceivable insulating material such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In one example, first insulator 140 may take the form of a shallow trench isolation (STI) within first doped well 124. An STI is an insulating structure formed by etching a trench into semiconductor material (e.g., first doped well 124) and filling the trench with an insulating material such as oxide and/or any other insulator discussed herein. An STI can be used to isolate one region of first doped well 124 from an adjacent region thereof, e.g., to isolate base region 130 from emitter region 136 as shown. Portions of first insulator 140 may also be positioned, e.g., adjacent the opposite horizontal end of base region 130, to further insulate base region 130 from other materials within doped well 124.

IC structure 120 includes a collector region 142 within first doped well 124. Collector region 142 has the second doping type (e.g., N-type doped) within first doped well 124, but is separate from base region 130 and emitter region 136. A collector contact 144 having a conductive material similar to or different from contact(s) 132, 138 can be on collector region 142 to electrically couple collector region 142 to one or more active elements of device 100 (FIG. 1), e.g., internal circuitry 102. A second insulator 146 within first doped well 124 can be horizontally between emitter region 136 and collector region 142. Second insulator 146 may be formed of the same or similar insulating materials as first insulator 140, and in some cases may be an STI, as discussed elsewhere herein.

To control whether electrical currents may travel from an active element such as internal circuitry 102 to ground GND/VSS through IC structure 120, additional elements may form an avalanche junction 150 with collector region 142. For example, IC structure 120 may include an insulative material 152 within first doped well 124, with a first horizontal end 51 adjacent collector region 142. Insulative material 152 may be formed of any conceivable insulating material, and in particular may include one or more layers of nitride material on first doped well 124. In some cases, insulative material 152 may take the form of a "silicide-blocking insulator," or "SAB" material. Such materials may include, e.g., silicon nitride insulators and/or less silicon oxide insulators. Insulative material 152 may be formed using any now known or later developed technique to form an insulator on doped semiconductor material (e.g., combinations of etch and deposition, selectively and/or non-selectively). A second end S2 of insulative material 152 may be adjacent a doped semiconductor region 154 within first doped well 124. Doped semiconductor region 154 may have the first doping type (i.e., the same doping type as first doped well 124 and base region 130). First doped well 124, in an example configuration, may be a continuous doped semiconductor region beneath each of base region 130, emitter region 136, collector region 142, and doped semiconductor region 154.

Insulative material 152 may have a depth within first doped well 124 that is significantly less than the depths of collector region 142 or insulative material 152 can be a thin layer deposited above the surface of first doped well 124. Insulative material 152 in particular may be as thin as possible to avoid mechanical stress and other unwanted effects under the material. The presence of insulative material on first doped well 124, as well as between collector region 142 and insulative material 152, can provide an avalanche junction 150 to provide a bi-directional diode junction within IC structure 120. As discussed elsewhere herein, applying a trigger voltage to collector region 142 can selectively permit current to flow across avalanche junction 150. To electrically couple doped semiconductor region 154 to a second active element (e.g., power clamp 106 in an example), a fourth contact 156 may be formed on doped semiconductor region 154. Fourth contact 156 may be formed of the same or similar conductive material(s) as contact(s) 132, 138, 144, or any other currently known or later developed conductive material.

In this configuration, electrical current from internal circuitry 102 (FIG. 1) may flow to ground GND/VSS through IC structure 120. During operation, a trigger voltage such as that of an ESD event may be applied to collector region 142 and/or doped semiconductor region 154. Such a voltage may enable current flow across avalanche junction 150, thereby electrically coupling two active elements (e.g., internal circuitry 102 and power clamp 106) through IC structure 120. IC structure 120 thus can route excessive currents to ground GND/VSS via emitter region 136 and collector region 142 in response to an ESD event. During operation, IC structure 120 may be configured to have a trigger voltage of at most approximately 11.0 volts (v), while maintaining a holding voltage of at most approximately 5.0 V, depending upon doping profiles these trigger voltages and holding voltages can have large ranges often 5V-200V ranges in silicon based devices.

Figure 3:
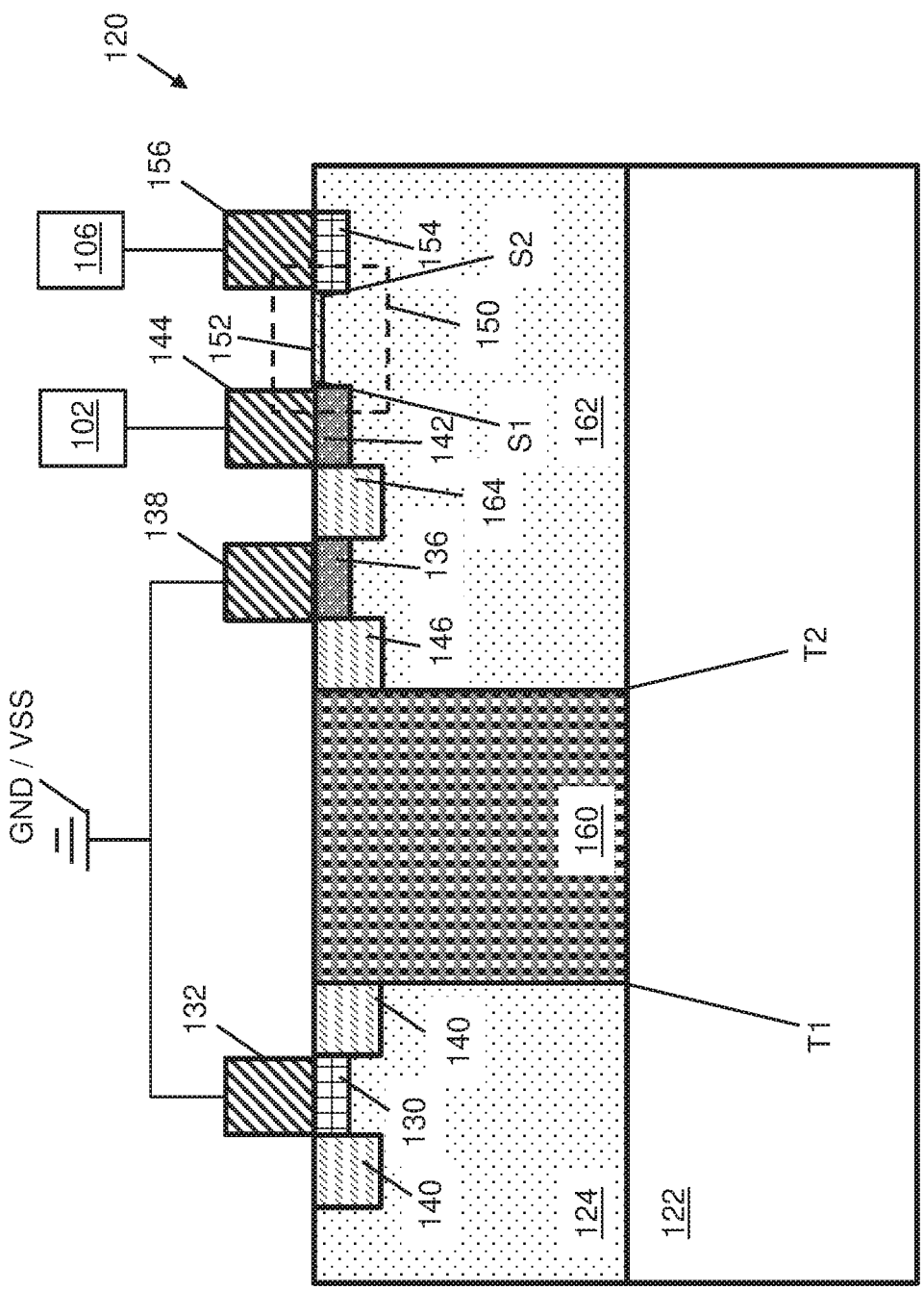
FIG. 3 shows a cross-sectional view an IC structure according to further embodiments of the disclosure.

Referring now to FIG. 3, further embodiments of the disclosure may include additional elements, e.g., to change the trigger voltage and thus the sensitivity of IC structure 120 to ESD events. IC structure 120 may include substrate 122 with various regions (e.g., first doped well 124, base region 130, emitter region 136, collector region 142, avalanche junction 150, insulative material 152, doped semiconductor region 154, etc.) thereover, as described for other implementations of IC structure 120. Here, a second doped well 160 may be adjacent first doped well 124. Base region 130 and first insulator(s) 140 may be formed in first doped well 124, and second doped well 160 separates these elements from other portions of IC structure 120. Second doped well 160 may have the second doping type (i.e., N-doping in the case that first doped well 124 is doped P-type, or vice versa). Although not shown specifically in FIG. 3, second doped well may alternatively have various additional doped regions (e.g., N+ regions) formed therein, and/or may also be connected to any of internal circuitry 102, power clamp 106, GND/VSS, a power rail (not shown), etc.

Second doped well 160 may be free of additional semiconductor regions and/or terminals therein, and more specifically may not include any of base region 130, emitter region 136, collector region 142, and/or doped semiconductor region 154 therein. A first end T1 of second doped well 160 may be positioned adjacent first doped well 124, and a second end T2 of second doped well 160 may be positioned adjacent a third doped well 162. Third doped well 162 may have the first doping type (e.g., the same doping type as first doped well 124). In this configuration, each of emitter region 136, collector region 142, second insulator 146, insulative material 152, and doped semiconductor region 154 may be formed solely within third doped well 162 instead of being formed in either of first doped well 124 or second doped well 160.

Third doped well 162 may include, e.g., second insulator 146 horizontally between emitter region 136 and second doped well 160, in addition to a third insulator 164 horizontally between emitter region 136 and collector region 142. IC structure 120 in such a configuration may operate substantially identically to other implementations discussed herein, but may feature different triggering and/or holding voltages. Such differences may arise from the additional electrical separation between base region 130 and region(s) 136, 142 through second doped well 160. In an example, IC structure 120 coupled to internal circuitry 102 and power clamp 106 may have a trigger voltage of at most approximately 9.5 V, and a holding voltage of at most approximately 5.0 V, based on the presence and size of second doped well 160.

Figure 4:
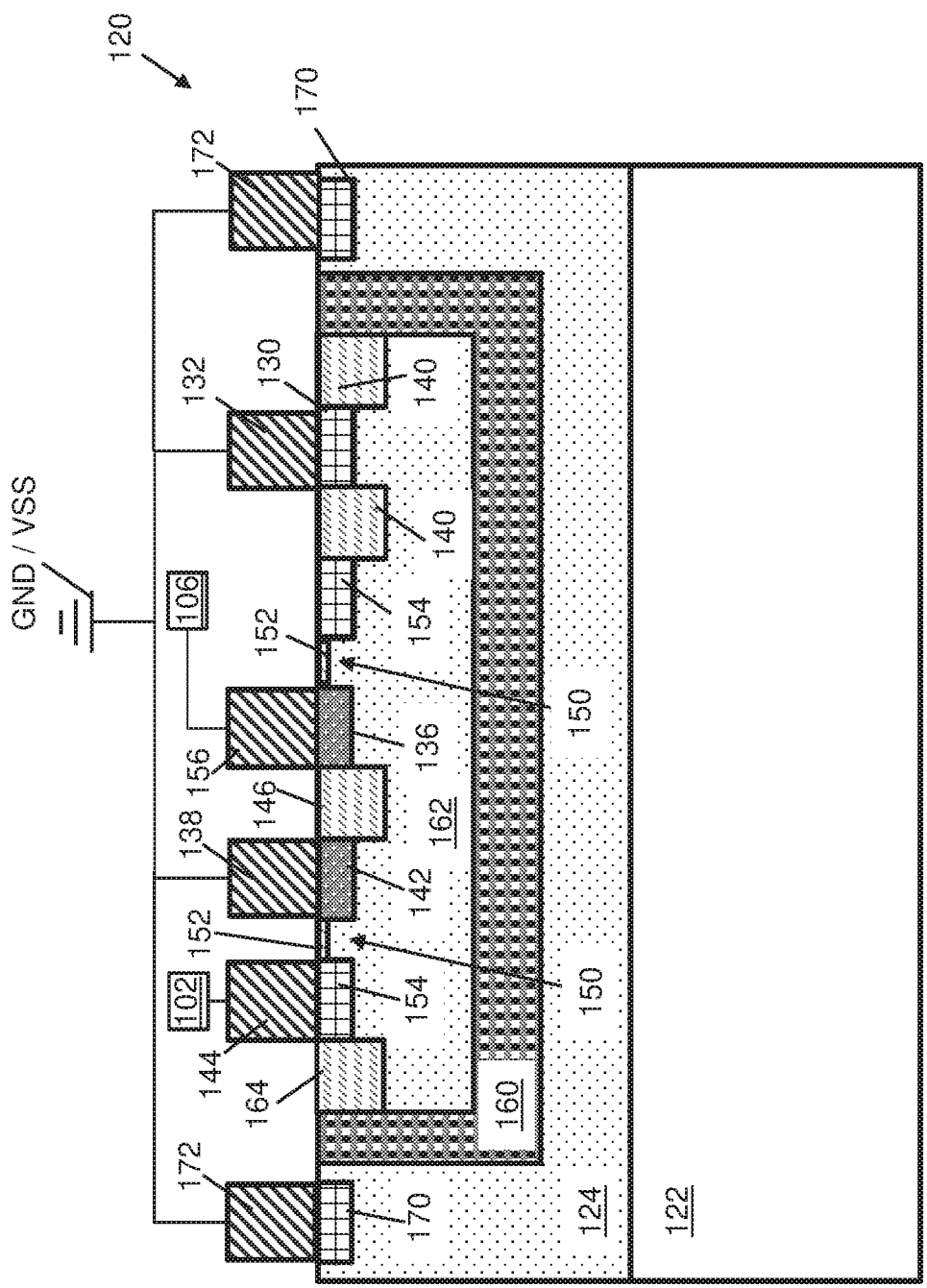
FIG. 4 shows a cross-sectional view an IC structure according to still further embodiments of the disclosure.

Turning to FIG. 4, further implementations of IC structure 120 may include rearranging and/or reshaping doped wells 124, 160, changing the number of insulative materials 152, and/or further modifications with respect to other IC structure 120 implementations. In such an example, first doped well 124 may not include base region 130 therein, and/or any other doped regions such as emitter region 136, collector region 142, insulative material 152, and/or doped semiconductor material(s) 154. However, first doped well 124 may include at least one external doped semiconductor material 170, so named by being external to third doped well 162, coupled to ground GND/VSS through a fourth contact 172 formed of any currently known or later developed conductive material. Second doped well 160 may be formed wholly within first doped well 124, while third doped well 162 may be formed wholly within second doped well 160. Such an arrangement of doped wells 124, 160, 162 is known as a "triple well" configuration. The various other regions and/or materials of IC structure 120 may be formed solely within and/or on third doped well 162.

IC structure 120 may include multiple avalanche junctions (e.g., in the FIG. 4 example), distinct from other implementations with only one avalanche junction 150 (e.g., as shown in FIGS. 2, 3). For instance, one avalanche junction 150 may be between collector region 142 and doped semiconductor region 154 substantially as provided in other implementations. Together, collector region 142 and doped semiconductor region 154 provide a pair of oppositely-doped semiconductor regions with insulative material 152 there between, thereby defining one avalanche junction 150. IC structure 120 may also include, e.g., another region of insulative material 152 in third doped well 162 between one doped semiconductor region 154 and emitter region 136. Emitter region 136 and doped semiconductor region 154 thus form another pair of oppositely-doped semiconductor regions. Here, an active element (e.g., power clamp 106) may be electrically coupled to each of emitter region 136 and doped semiconductor region 154 through one or more third contact(s) 156. IC structure 120 otherwise may remain similar to other implementations. IC structure 120 can include first insulator 140 to electrically separate base region 130 from other materials. Although not shown specifically in FIG. 4, additional regions of first insulator 140 and base region 130 may be formed on third doped well 162 (e.g., on the left and right sides adjacent second doped well 160 in a mirrored arrangement). Second insulator 146 may electrically separate emitter region 136 and doped semiconductor region 154 of one avalanche junction 150 from other materials. Third insulator 164 may electrically separate collector region 142 and doped semiconductor region 154 from other materials in third doped well 162. During operation, such embodiments of IC structure 120 may feature a trigger voltage of at most, e.g., approximately 9.5 V and a holding voltage of approximately 5.0 V.

Embodiments of the disclosure may provide several technical and commercial advantages, some of which here discussed herein by way of example. Embodiments of IC structure 120 provide, e.g., a structure capable of operating as an ESD element (e.g., ESD element(s) 110 (FIG. 1)) with reduced trigger voltages, but with similar holding voltages to other types of ESD elements without avalanche junction(s) 150 therein. In some cases, the placement of a doped well contact outside of an N-well (e.g., an N-well ring or intermediate well) will increase the internal resistance of IC structure 120 and thereby further reduce the trigger voltage. The inclusion of avalanche junction 150 also enables bipolar current flow through IC structure 120, making it suitable for counteracting multiple types of ESD events and/or operational settings. As compared to conventional ESD element(s) and/or operationally similar IC structure(s), embodiments of IC structure 120 occupy a similar surface area within a device such as device 100.

The descriptions of the various embodiments of the present disclosure have been presented for purposes of illustration, but are not intended to be exhaustive and/or limited to the embodiments disclosed. Many modifications and variations will be apparent to those of ordinary skill in the art within the scope and spirit of the described embodiments The terminology used herein was chosen to best explain the principles of the embodiments, the practical application and/or technical improvement over technologies found in the marketplace, and/or to enable others of ordinary skill in the art to understand the embodiments disclosed herein.

What is claimed is:

1. An integrated circuit (IC) structure, comprising:
a doped well in a semiconductor substrate, the doped well having a first doping type;
a base region within the doped well, and having the first doping type;
an emitter region within the doped well and having a second doping type opposite the first doping type;
a first insulator within the doped well, horizontally between the base region and the emitter region;
a collector region within the doped well and having the second doping type;
a second insulator within the doped well, horizontally between the collector region and the emitter region;
an insulative material within the doped well, the insulative material having a first end horizontally adjacent the collector region and a second end opposite the first end; and
a doped semiconductor region within the doped well adjacent the second end of the insulative material, wherein the doped semiconductor region is of the first doping type, such that an avalanche junction is defined between the collector region and the doped semiconductor region across the doped well.

2. The IC structure of claim 1, wherein the insulative material comprises a nitride having a depth below an upper surface of the doped well that is less than a depth of the collector region and a depth of the doped semiconductor region below an upper surface of the doped well.

3. The IC structure of claim 1, further comprising:
a first contact to the collector region; and
a second contact to the doped semiconductor region,
wherein the base region and the emitter region are each coupled to ground.

4. The IC structure of claim 3, further comprising:
a first active element coupled to the collector region through the first contact; and
a second active element coupled to the doped semiconductor region through the second contact,
wherein the IC structure is an electrostatic discharge (ESD) element between the first active element and the second active element.

5. The IC structure of claim 4, wherein a trigger voltage of the ESD element is at most approximately 11.0 volts (V).

6. The IC structure of claim 5, wherein a holding voltage of the ESD element is at most approximately 5.0 volts (V).

7. The IC structure of claim 1, wherein each of the first insulator and the second insulator include shallow trench isolation (STI) regions within the doped well.

8. The IC structure of claim 1, wherein the doped well is a continuous doped semiconductor region beneath each of the base region, the emitter region, the collector region, the insulative material, and the doped semiconductor region.

9. An integrated circuit (IC) structure, comprising:
a first doped well in a semiconductor substrate, and having a first doping type;
a base region within the first doped well, and having the first doping type;
a second doped well having a first end adjacent the first doped well, and a second end opposite the first end, the second doped well having a second doping type opposite the first doping type;
a first insulator within the first doped well, horizontally between the base region and the second doped well;
a third doped well adjacent the second end of the second doped well, the third doped well having the first doping type;
an emitter region within the third doped well, the emitter region having the second doping type;
a second insulator within the third doped well, horizontally between the emitter region and the second doped well;
a collector region within the third doped well and having the second doping type;
a third insulator within the third doped well, horizontally between the emitter region and the collector region;
an insulative material within the third doped well, the insulative material having a first end horizontally adjacent the collector region and a second end opposite the first end; and
a doped semiconductor region within the third doped well adjacent the second end of the insulative e material, wherein the doped semiconductor region is of the first doping type, such that an avalanche junction is defined between the collector region and the doped semiconductor region across the doped well.

10. The IC structure of claim 9, further comprising:
a first contact to the collector region; and
a second contact to the doped semiconductor region,
wherein the base region and the emitter region are each coupled to ground.

11. The IC structure of claim 10, further comprising:
a first active element coupled to the collector region through the first contact; and
a second active element coupled to the doped semiconductor region through the second contact;
wherein the IC structure is an electrostatic discharge (ESD) element between the first active element and the second active element.

12. The IC structure of claim 11, wherein a trigger voltage of the ESD element is at most approximately 9.5 volts (V), and wherein a holding voltage of the ESD element is at most approximately 5.0 volts (V).

13. The IC structure of claim 9, wherein the insulative material comprises a nitride having a depth below an upper surface of the third doped well that is less than a depth of the collector region and a depth of the doped semiconductor region below an upper surface of the third doped well.

14. The IC structure of claim 9, wherein the first insulator includes a first shallow trench isolation (STI) within the first doped well, and wherein the second insulator and the third insulator each include STIs within the third doped well.

* * * * *